(12) United States Patent
Dohi

(10) Patent No.: US 6,686,287 B1
(45) Date of Patent: Feb. 3, 2004

(54) SEMICONDUCTOR DEVICE MANUFACTURING METHOD AND APPARATUS

(75) Inventor: Takayoshi Dohi, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/353,661

(22) Filed: Jul. 15, 1999

(30) Foreign Application Priority Data

Jul. 15, 1998 (JP) .......................................... 10-199897

(51) Int. Cl.[7] .......................................... H01L 21/302
(52) U.S. Cl. .................... 438/706; 438/710; 438/712; 438/720; 216/47; 216/59
(58) Field of Search ................................ 438/710, 706, 438/712, 717, 720, 7; 216/47, 59, 60

(56) References Cited

U.S. PATENT DOCUMENTS

| | | | | |
|---|---|---|---|---|
| 5,322,590 A | * | 6/1994 | Koshimizu | 156/626 |
| 5,352,902 A | * | 10/1994 | Aoki | 250/575 |
| 5,450,205 A | * | 9/1995 | Sawin et al. | 356/382 |
| 5,728,253 A | * | 3/1998 | Saito et al. | 156/345 |
| 5,989,928 A | * | 11/1999 | Nakata et al. | 438/7 |

FOREIGN PATENT DOCUMENTS

| | | |
|---|---|---|
| JP | 6-124923 | 5/1994 |
| JP | 6-318572 | 11/1994 |
| JP | 7-106583 | 4/1995 |
| JP | 7-70579 | 7/1995 |
| JP | 7-240405 | 9/1995 |
| JP | 8-274079 | 10/1996 |
| JP | 9-36090 | 2/1997 |
| JP | 9-129598 | 5/1997 |
| JP | 10-50662 | 2/1998 |

* cited by examiner

Primary Examiner—Nadine G. Norton
Assistant Examiner—Lan Vinh
(74) Attorney, Agent, or Firm—Pillsbury Winthrop LLP

(57) ABSTRACT

In patterning a silicon-containing thin film formed over an insulating substrate by means of vapor-phase chemical etching using a resist pattern formed on the thin film as a mask, a luminescence intensity A of wavelengths in a predetermined wavelength range and a luminescence intensity B at a specific wavelength are detected during the patterning. The luminescence intensity B is divided by the luminescence intensity A to produce a divide signal (B/A). The time of termination of the patterning is determined based on a change of the divide signal.

19 Claims, 8 Drawing Sheets

SEMICONDUCTOR DEVICE MANUFACTURING METHOD AND APPARATUS

BACKGROUND OF THE INVENTION

The present invention relates to a method of manufacturing a semiconductor device and an apparatus for manufacturing the same and, more specifically, to a semiconductor device manufacturing method and apparatus using vapor-phase chemical dry etching.

In recent years, liquid crystal display devices have been extensively used in various fields because of their features of lightweight, flatness, and low power consumption. In particular, active matrix type liquid crystal display devices that are provided with a switching element, such as a thin film transistor (hereinafter referred to as TFT), for each display pixel have been in wide use because they can provide good display image with no crosstalk between adjacent display pixels.

In addition, an attempt has recently been made to form integrally driver circuits onto one of substrates that make up a liquid crystal display panel for the purpose of reducing the number of connections to external circuitry and realizing even higher-definition and thinner display devices.

Some problems are involved in the realization of such a high-definition liquid crystal display device. For example, in the process of manufacturing the array substrate for a liquid crystal display device, various films, which are large in comparison with silicon wafers, must be subjected to fine and uniform patterning over the entire surface.

As a patterning process, there has known a reactive ion etching (RIE) and a vapor-phase chemical dry etching (CDE). In an RIE, a high frequency voltage of, e.g., 13.56 MHz is applied to a substrate to be processed so that an ion is continuously drawn to the substrate based on a self-bias generated at the substrate. In a CDE, a low frequency voltage of, e.g., 6 MHz is applied to a substrate to be processed so that an ion is intermittently drawn to the substrate. In this case, a self-bias of the substrate is substantially zero.

For patterning by dry etching such as RIE or CDE, in order to achieve fine patterning with precise control in each area of the surface, it is important to set accurately the point of time at which the etching terminates, or the end point of etching.

As concerns the end point setting of the etching, various techniques have been proposed hitherto.

For example, in Japanese Unexamined Patent Publication No. 7-70579 or No. 7-66937, there is disclosed an end point determining technique of RIE process that separates variations in process conditions, such as RF power, for obtaining accurate computational results by using a differentiating value based on (electromagnetic radiation intensity at a specific wavelength)/(total electromagnetic radiation intensity). In addition, in Japanese Unexamined Patent Publication No. 9-129597, there is disclosed a technique for improving the accuracy of the end point detection by storing a signal detected when a detection condition is determined as a reference signal, making a comparison between the reference signal and a detected signal for the luminescence intensity at a specific wavelength involved in etching, and determining a signal amplification factor on the basis of the comparison result.

However, no good techniques have been proposed for detecting the end point in performing the CDE process over a large area as in the manufacturing process of liquid crystal display devices. For this reason, with the conventional techniques it is difficult to define fine patterns with precision without variations.

In the manufacturing process of liquid crystal display devices, a metal film or silicon film is patterned by being etched through a resist pattern and, after the termination of etching, a so-called ashing process is performed to remove the resist pattern.

The etching and the ashing process are each performed on a different material, which involves the use of separate processing apparatuses. However, the use of separate processing apparatuses for etching and ashing is time-consuming, lowering manufacturing efficiency, and increasing manufacturing cost.

BRIEF SUMMARY OF THE INVENTION

It is therefore an object of the present invention to provide a semiconductor device manufacturing method and apparatus which allows high-accuracy patterning over a large area using CDE and the manufacture of semiconductor devices having good characteristics.

Another object of the present invention is to provide a semiconductor device manufacturing method and apparatus which allows etching and ashing processes to be performed in the same apparatus and the end point of each process to be detected accurately.

Still another object of the present invention is to provide a semiconductor device manufacturing method and apparatus which allows different materials to be etched and the end point of the etching of each material to be detected accurately.

According to an aspect of the present invention, there is provided a method of manufacturing a semiconductor device comprising the steps of: forming a thin film containing silicon over an insulating substrate; forming a resist pattern on the thin film; and patterning the thin film by means of vapor-phase chemical etching using the resist pattern as a mask, the patterning step including a step of detecting, during the vapor-phase chemical etching, a luminescence intensity A of wavelengths within a predetermined wavelength range and a luminescence intensity B at specific wavelengths included in the predetermined wavelength range, a step of dividing the luminescence intensity B by the luminescence intensity A to produce a divide signal, and a step of determining the time of termination of the patterning on the basis of the divide signal.

This manufacturing method allows the end point of vapor-phase chemical etching to be detected with accuracy, allowing for the manufacture of a high-definition and high-performance semiconductor device.

According to another aspect of the present invention, there is provided a method of manufacturing a semiconductor device comprising the steps of: forming a silicon-containing thin film over an insulating substrate; forming a resist pattern on the thin film; and patterning the thin film by means of vapor-phase chemical etching using the resist pattern as a mask; and after the termination of the patterning, ashing the resist pattern to remove it, the patterning step including a step of detecting a luminescence intensity at a specific wavelength during the patterning and a step of determining the time of termination of the patterning on the basis of a change in the luminescence intensity, and the ashing step including a step of detecting the luminescence intensity at the specific wavelength during the ashing and a step of determining the time of termination of the ashing on the basis of a change in the luminescence intensity.

In the above manufacturing method, each of the patterning and ashing steps includes a step of detecting the luminescence intensity A of wavelengths within a predetermined wavelength range and the luminescence intensity B at specific wavelengths included in the predetermined wavelength range, a step of dividing the luminescence intensity B by the luminescence intensity A to produce a divide signal, and a step of determining the time of termination of the patterning or ashing step on the basis of a change of the divide signal.

The manufacturing method thus arranged allows the common apparatus to be used to detect the time of termination of the patterning and ashing on the basis of the common specific wavelength, resulting in the reduced manufacturing time and cost.

According to still another aspect of the present invention, there is provided a method of manufacturing a semiconductor device comprising the steps of: forming a first thin film containing silicon over an insulating substrate; forming a first resist pattern on the first thin film; and patterning the first thin film by means of vapor-phase chemical etching using the first resist pattern as a mask; forming a second thin film containing silicon on the patterned first thin film; forming a second resist pattern on the second thin film; and patterning the second thin film by means of vapor-phase chemical etching using the second resist pattern as a mask; the patterning step for the first thin film including a step of detecting a luminescence intensity at a specific wavelength during the patterning and a step of determining the time of termination of the patterning on the basis of a change in the luminescence intensity, and the patterning step for the second thin film including a step of detecting the luminescence intensity at the specific wavelength during the patterning and a step of determining the time of termination of the patterning on the basis of a change in the luminescence intensity.

This manufacturing method allows different films to be patterned through the use of the same apparatus, achieving a saving of space for manufacture line. Moreover, the end point can be set up accurately for each film, allowing for the manufacture of a high-definition and high-performance semiconductor device.

According to a further aspect of the present invention, there is provided a semiconductor device manufacturing apparatus for patterning a silicon-containing thin film formed over an insulating substrate by means of vapor-phase chemical etching using a resist pattern formed on the thin film as a mask, comprising: a housing defining a vacuum processing chamber in which the insulating substrate is placed; gas supply means for introducing an etching gas into the vacuum processing chamber; plasma generator for generating a plasma in the vacuum processing chamber; a photosensor for detecting the luminescence intensity A of wavelengths within a given wavelength range and the luminescence intensity at a specific wavelength included in the given wavelength range in the vacuum processing chamber during the vapor-phase chemical etching; and control means for controlling the plasma generator, the control means including a division section for dividing the luminescence intensity B by the luminescence intensity A to produce a divide signal and a determining section for determining the time of termination of the patterning on the basis of the divide signal.

According to still another aspect of the present invention, there is provided a semiconductor device manufacturing apparatus for patterning a silicon-containing thin film formed over an insulating substrate by means of vapor-phase chemical etching using a resist pattern formed on the thin film as a mask and then ashing the resist pattern by means of vapor-phase chemical etching to remove it, the apparatus comprising: a housing defining a vacuum processing chamber in which the insulating substrate is placed; gas supply means for introducing an etching gas into the vacuum processing chamber; plasma generator for generating a plasma in the vacuum processing chamber; a photosensor for detecting a luminescence intensity at a specific wavelength within the vacuum processing chamber during the vapor-phase chemical etching; and control means for determining the time of termination of the patterning and ashing in responsive to the detected luminescence intensity and controlling the plasma generating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, a method and apparatus for manufacturing a semiconductor device according to an embodiment of the present invention will be described in detail with reference to the accompanying drawings in terms of a method and apparatus for manufacturing TFTS of the CMOS structure in an array substrate used in an active matrix type liquid crystal display device into which driver circuits are integrally incorporated.

Before proceeding with a description of the embodiment, the principles of the invention will be described briefly for better understanding of the invention.

In the following description, a self-bias generating at a substrate both in chemical dry etching and ashing is substantially zero.

Figure 1:
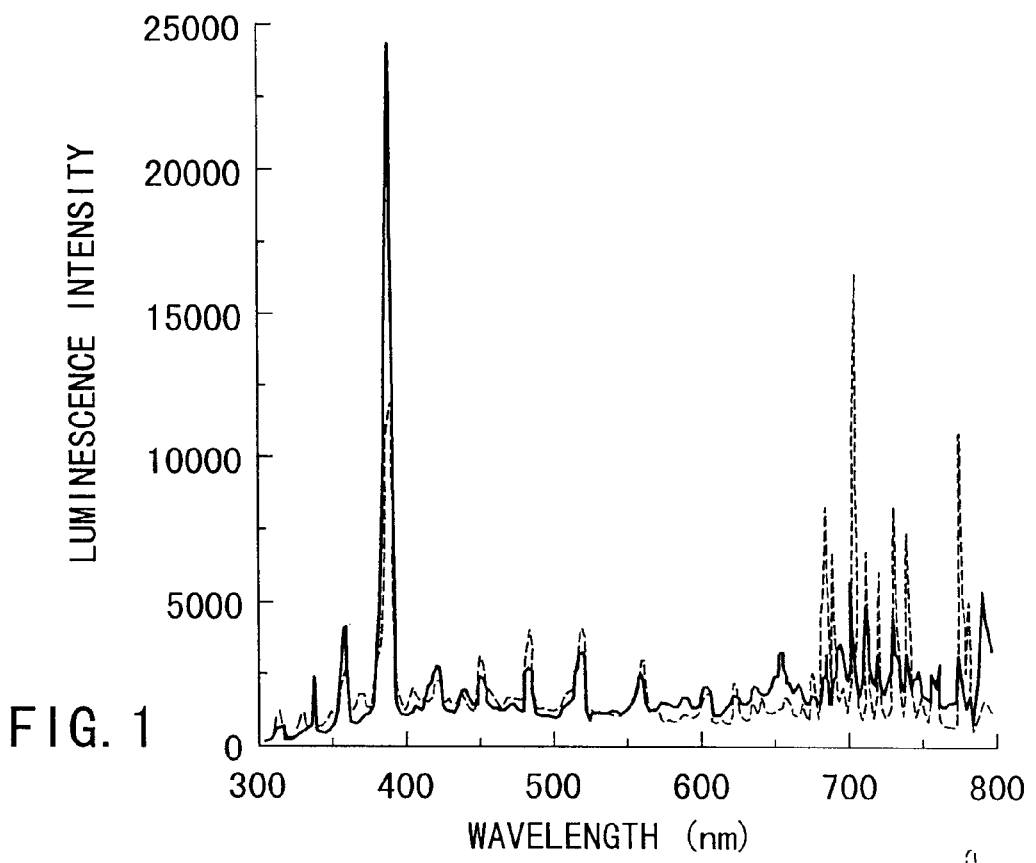
FIG. 1 is a view showing luminescence intensity versus wavelength in emission spectrum during etching of a thin film of silicon oxide and at the termination of etching.

In FIG. 1, luminescence spectra during etching and at the termination of etching are shown by solid and chained lines, respectively, when a thin film of silicon nitride (SiNx) of 3,000 Å in thickness is deposited over a glass substrate formed on top with a thin film of silicon dioxide ($SiO_2$) and then patterned by means of CDE with a resist mask placed thereon. In this case, a mixed gas of $CF_4$ and $O_2$ is used as the etching gas.

Figure 2:
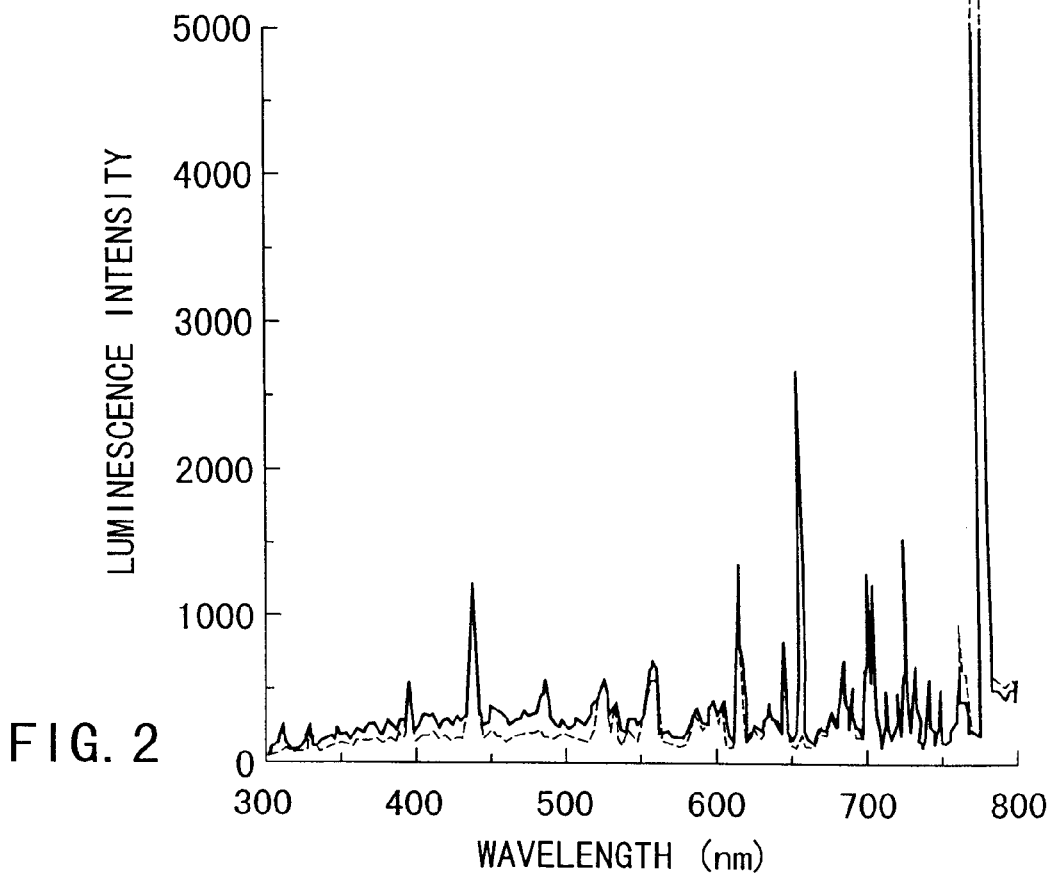
FIG. 2 is a view showing luminescence intensity versus wavelength in emission spectrum during ashing of a thin film of silicon oxide and at the termination of ashing.

In FIG. 2, luminescence spectra during ashing and at the termination of ashing are shown by solid and chained lines, respectively, when the resist mask is subjected to ashing by means of CDE after the etching process has been terminated. In this case as well as in the case of etching, a mixed gas of $CF_4$ and $O_2$ is used as the etching gas.

We examined luminescence spectra during etching and at the termination of etching in patterning a thin film of polycrystalline silicon (p-Si) of 500 Å in thickness deposited over a glass substrate deposited on top with a thin film of silicon dioxide ($SiO_2$) by means of CDE using a resist mask placed thereon. Further, in ashing the resist mask we examined luminescence spectra during ashing and at the termination of ashing. In these etching and ashing processes, as in the above cases, a mixed gas of $CF_4$ and $O_2$ was used as the etching gas.

The detection of the end point of the etching and ashing is expected to involve detecting wavelengths emitted by molecules or atoms which are contained mainly in a material to be etched but not contained in the etching gas or the underlying components or detecting a wavelength of luminescence by a gas component whose luminescence intensity greatly changes on reaction with the material to be etched.

FIGS. 1 and 2 and the results of the above examinations have showed that the detection of a wavelength of 655 nm allows the end point of etching of non-single crystalline silicon, such as SiNx or p-Si, to be detected and the detection of a wavelength of 656 nm allows the end point of ashing of the resist mask to be detected. That is to say, the detection of a given range of wavelengths that contain at least 655 nm and 656 nm was found to allow the end point of etching of a silicon semiconductor film and the end point of ashing of a resist mask to be detected in common. The wavelengths of 655 nm and 656 nm are expected to result from luminescence of hydrogen atoms.

In addition, the total luminescence intensity was found to increase at near the end point of ashing of a resist mask probably because luminescence by O atoms or F atoms increases. Thus, the present invention determines a correct end point by dividing a value for the luminescence intensity at a specific wavelength by a value for the luminescence intensity of all wavelengths and controlling the end point on the basis of the resulting value. Such an approach can successfully remove variations in intensity of luminescence by a plasma itself to detect characteristically only changes of luminescence intensity at a specific wavelength of, for example, 655 nm or 656 nm.

Figure 3A:
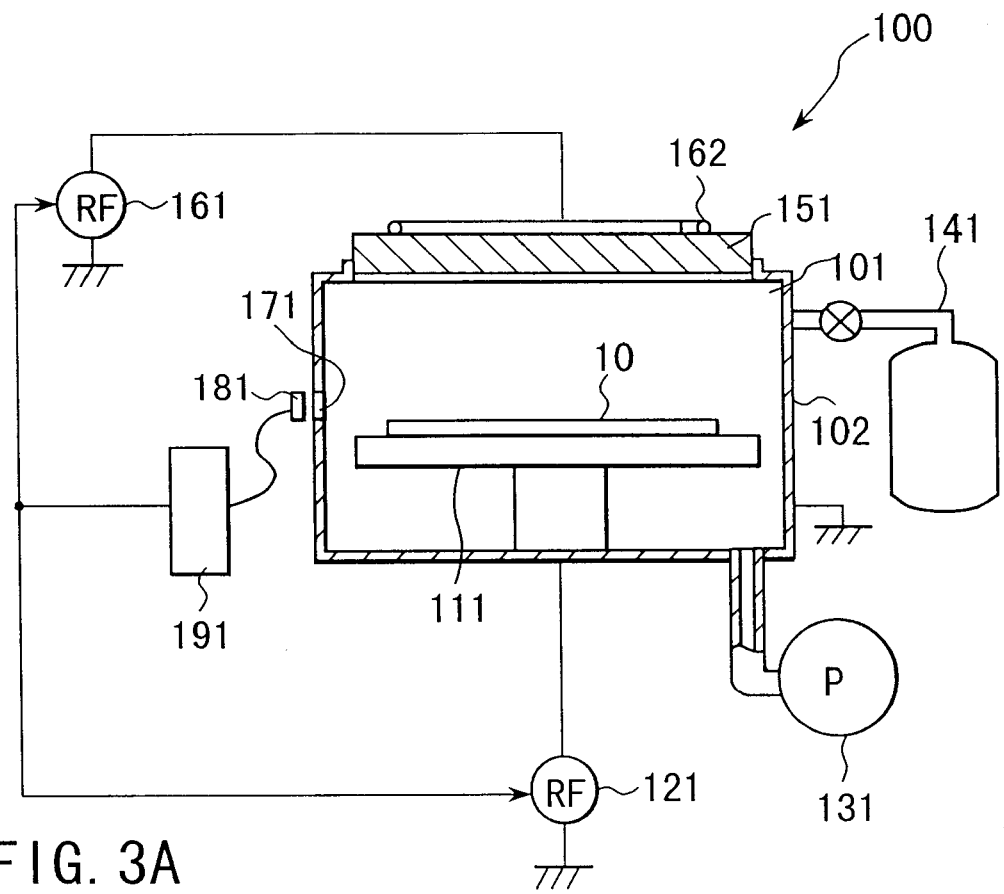
FIG. 3A is a view schematically showing a CDE apparatus according to a first embodiment the present invention.

Next, an embodiment of the present invention will be described in detail. First, a CDE apparatus will be described as a manufacturing apparatus according to this embodiment. As shown in FIG. 3A, the CDE apparatus 100 comprises a box-like housing 102 that defines a vacuum processing chamber 101, a susceptor 111, arranged in the processing chamber, that supports a substrate or substrate to be processed and is connected with a radio-frequency source 121, a pump 131 that evacuates the processing chamber, and a gas supply system 141 for supplying an etching gas into the processing chamber 101.

A dielectric plate 151 is placed on the top of the housing 102 so as to oppose to the susceptor 111. Further, on the dielectric plate 151 is placed an antenna 162 that is connected with a radio-frequency source 161 to induce a plasma within the vacuum processing chamber 101. A window 171 is provided in a sidewall of the housing 102, which allows the top of the susceptor 111 to be monitored from outside. A photosensor 181 is arranged to be opposite to the window 171. The photosensor 181 is connected to a controller 191.

The photosensor 181 is arranged to measure the total luminescence intensity L1 of wavelengths in a range of, for example, 300 to 800 nm and the specific luminescence intensity L2 of wavelengths in a range of 650 to 660 nm including specific wavelengths of 655 nm and 656 nm and provide output voltages VL1 and VL2 corresponding to the luminescence intensities L1 and L2, respectively. To allow measurement of the specific luminescence intensity L2, the photosensor 181 has the center wavelength in measurement set at 655 nm and the half band width set to 10 nm. The narrower the wavelength range to be detected, the more accurate the detection will be. In measuring the specific luminescence intensity L2, it is desirable to set the wavelength range to 20 nm or less, preferably to 10 nm or less.

Figure 3B:
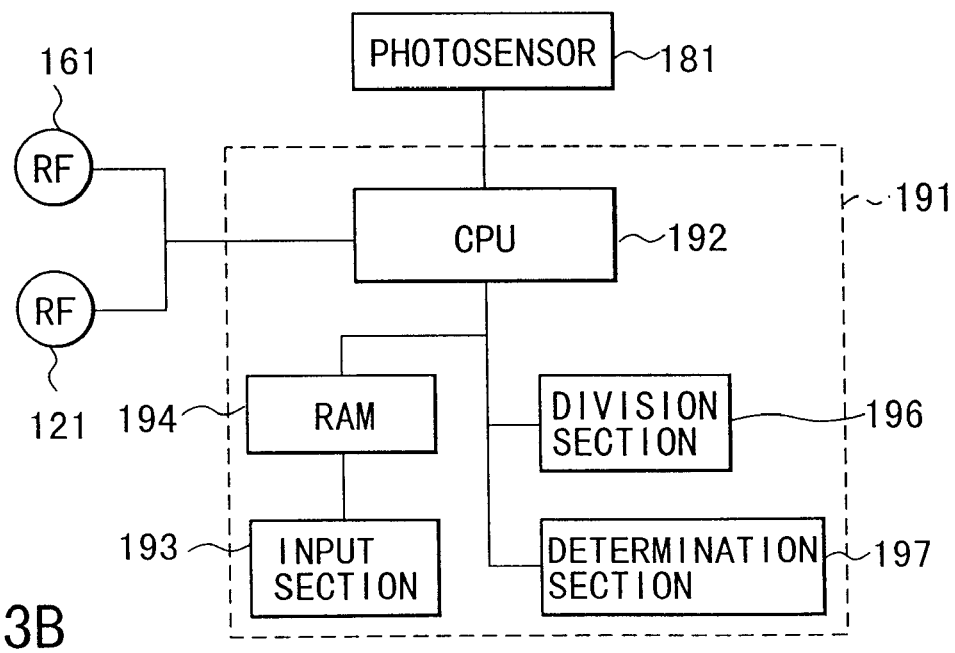
FIG. 3B is a block diagram of the controller for the CDE apparatus.

As shown in FIG. 3B, the controller 191 comprises a CPU 19 that controls the operation of the entire apparatus, a RAM 194 that stores data on all wavelengths over a given range, specific wavelengths, overetching rate, etc., which have been entered through an input section 193, a division section 196 that computes a divided voltage, and a determination section 197 that determines the end point of etching or ashing.

The controller 191 divides a luminescence intensity voltage VL2 corresponding to the specific luminescence intensity L2 by a luminescence intensity voltage VL1 corresponding to the total luminescence intensity L1 to produce a divided voltage VL2/VL1. The gradient of the divided voltage VL2/VL1 is detected in the following manner and then used as a differential signal S. Here, the time is taken as t (seconds) and the divided voltage as f(t)(V). The divided voltage is sampled at intervals of 0.5 seconds. From these samples, the gradient is determined at intervals of 0.5 seconds in accordance with [f(t+9)−f(t)]/9. The end point is determined based on the differential signal S to stop the operation of the radio-frequency sources 121 and 161 and terminate the etching or ashing. The narrower the interval at which the divided voltage is sampled, the better the detection accuracy will be.

Next, a method of manufacturing a CMOS type of TFT on the array substrate of a TFT-LCD with integrally incorporated driver circuits will be described in detail.

Figure 4A:
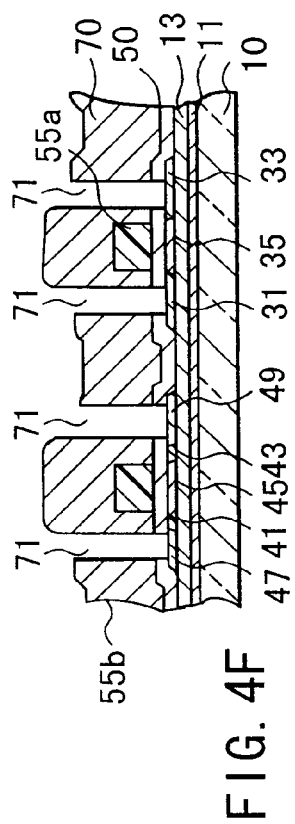
FIGS. 4A through 4H are sectional views steps of manufacturing a semiconductor device.

First, as shown in FIG. 4A, on a transparent glass substrate (insulating substrate) 10, which is 500 mm wide, 600 mm long and 0.7 mm thick, are formed by means of plasma CVD a thin film 11 of $SiO_2$, a thin film 13 of SiNx, and a thin film of amorphous silicon (a-Si:H), each at a thickness of 50 nm. After that, for the purpose of preventing ablation in crystallization to be described later, the a-Si:H film is subjected to dehydrogenation in a nitrogen ambient to reduce the concentration of hydrogen.

To control the TFT threshold Vth, boron (B) ion is doped into the a-Si:H film. Subsequently, the a-Si:H film is subjected to excimer laser annealing (ELA) for solid-phase growth into polycrystalline silicon (p-Si). For the ELA, a beam was used which has a fluence of 300 mJ/cm$^2$ and cross-sectional dimensions of 0.3×400 mm. The beam was scanned at a pitch of 15 micrometers for crystallization of a-Si:H.

After the formation of a resist mask on the polysilicon film, the previously described CDE apparatus is used to pattern the p-Si film into island p-Si films 30 and 40. For this patterning process, a $CF_4$ gas and an $O_2$ gas are used which have their flow rates set to 150 and 350 sccm, respectively, and their pressure set to 20 Pa.

Figure 5:
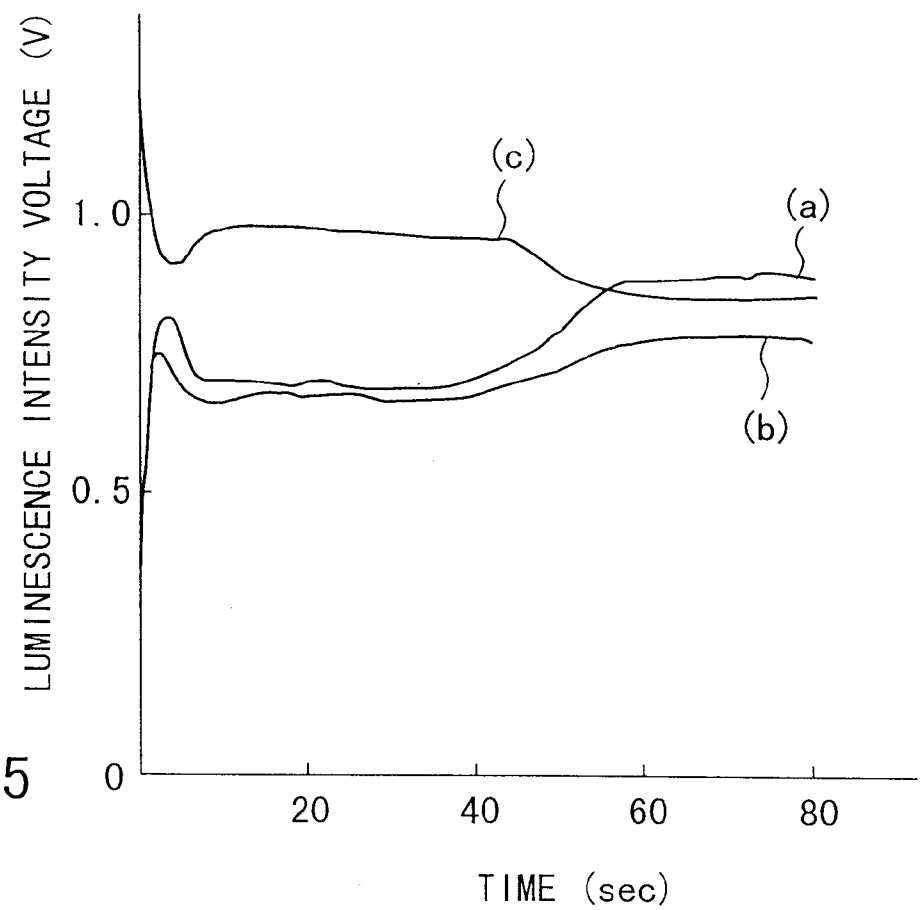
FIG. 5 is a view showing luminescence intensity voltage versus time during etching.

In FIG. 5, the luminescence intensity voltage during etching is plotted against time. In this figure, a curve (a) indicates the total luminescence intensity voltage VL1 for wavelengths in the range of 300 to 800 nm, a curve (b) indicates the specific luminescence intensity voltage VL2 for wavelengths in the range of 650 to 660 nm, and a curve (C) indicates the divided voltage VL2/VL1. From this figure, it can be seen that the change of the divided voltage VL2/VL1 is large in comparison with those in the total luminescence intensity voltage VL1 and the specific luminescence intensity voltage VL2 and is thus fit to detect the end point.

In this embodiment, the end point is set up in the following manner to terminate the etching.

Taking the divided voltage VL2/VL1 measured ten seconds after the initiation of etching as 100%, the decision of the end point is commenced at a point of time when the divided voltage falls below 98%. The reason why the divided voltage ten seconds after the initiation of etching is taken as 100% is that the luminescence of the object to be etched does not become stabilized for two or three seconds after the initiation of the etching due to the effect of the native oxide on the p-Si film and instability of plasma discharge itself.

Figure 6:
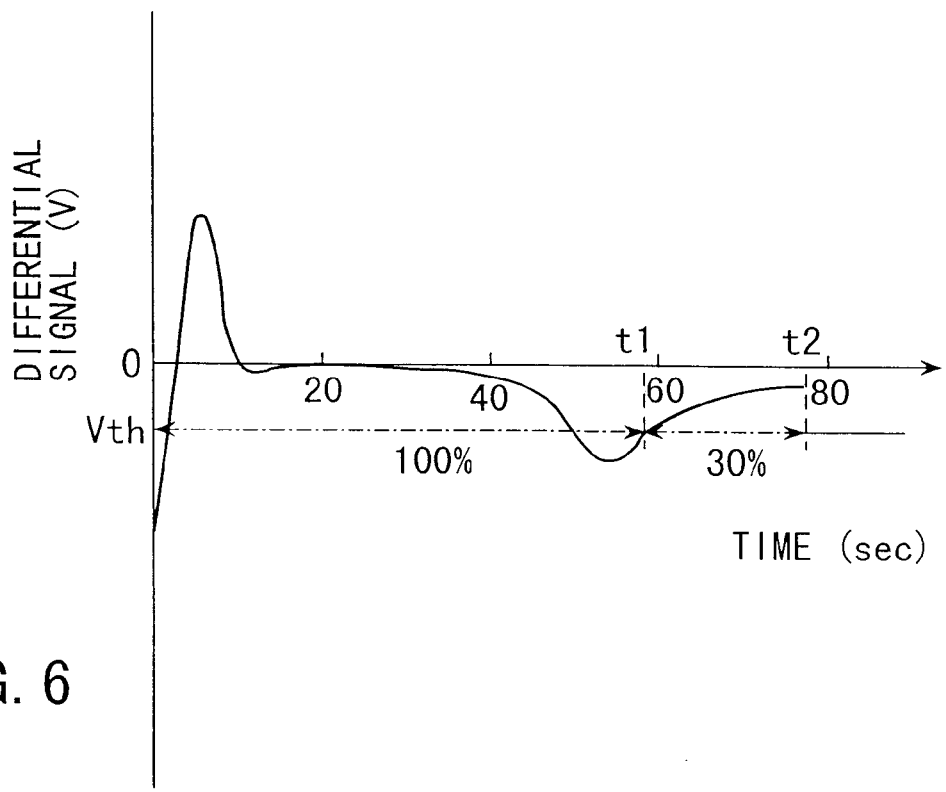
FIG. 6 is a view showing differential signal intensity versus time during etching.

FIG. 6 shows a differential signal S resulting from differentiating the divided voltage VL2/VL1 with respect to time. In this embodiment, the point of time at which the differential signal crosses the threshold voltage (Vth) of −0.1V on a second time was taken to be the end point. With the etching time (t1) until the end point taken as 100%, overetching is performed by an additional time corresponding to 30% of the etching time before the etching is terminated. The threshold voltage Vth varies with the material to be etched. The overetching time (t2−t1) may be set to a given length of time; however, in view of variations in etching rate and film thickness, it is desirable to set the overetching time to a certain percentage of the etching time (t1) until the end point as in the present embodiment. The rate of overetching is appropriately set according to the film species to be etched.

Figure 7:
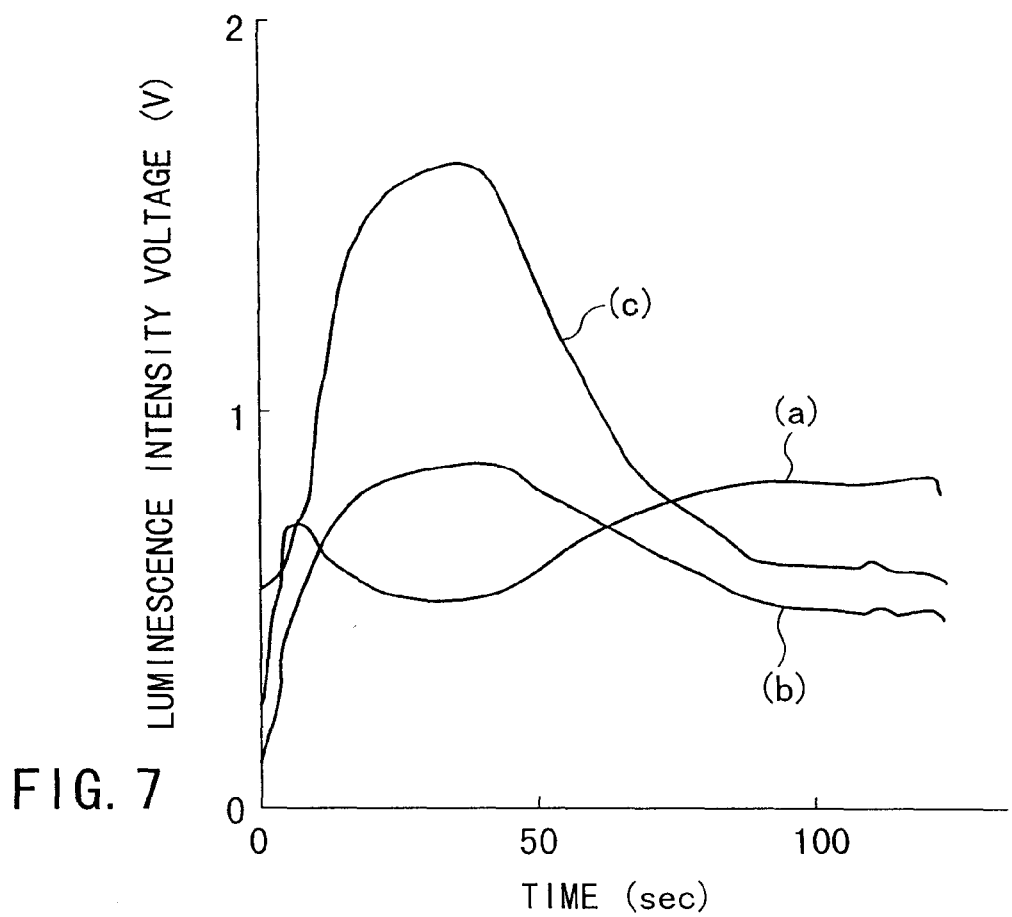
FIG. 7 is a view showing luminescence intensity voltage versus time during ashing.

After the termination of the etching process, the resist mask is subjected to ashing with the flow rates of the $CF_4$ and $O_2$ gases changed to 125 sccm and 1875 sccm, respectively. In FIG. 7, the luminescence intensity voltage during ashing is plotted against time. In this figure, a curve (a) indicates the total luminescence intensity voltage VL1 for wavelengths in the range of 300 to 800 nm, a curve (b) indicates the specific luminescence intensity voltage VL2 for wavelengths in the range of 650 to 660 nm, and a curve (C) indicates the divided voltage VL2/VL1. From this figure, it can be seen that the change in the divided voltage VL2/VL1 is large in comparison with those in the total luminescence intensity voltage VL1 and the specific luminescence intensity voltage VL2 and is thus fit to detect the end point.

Figure 8:
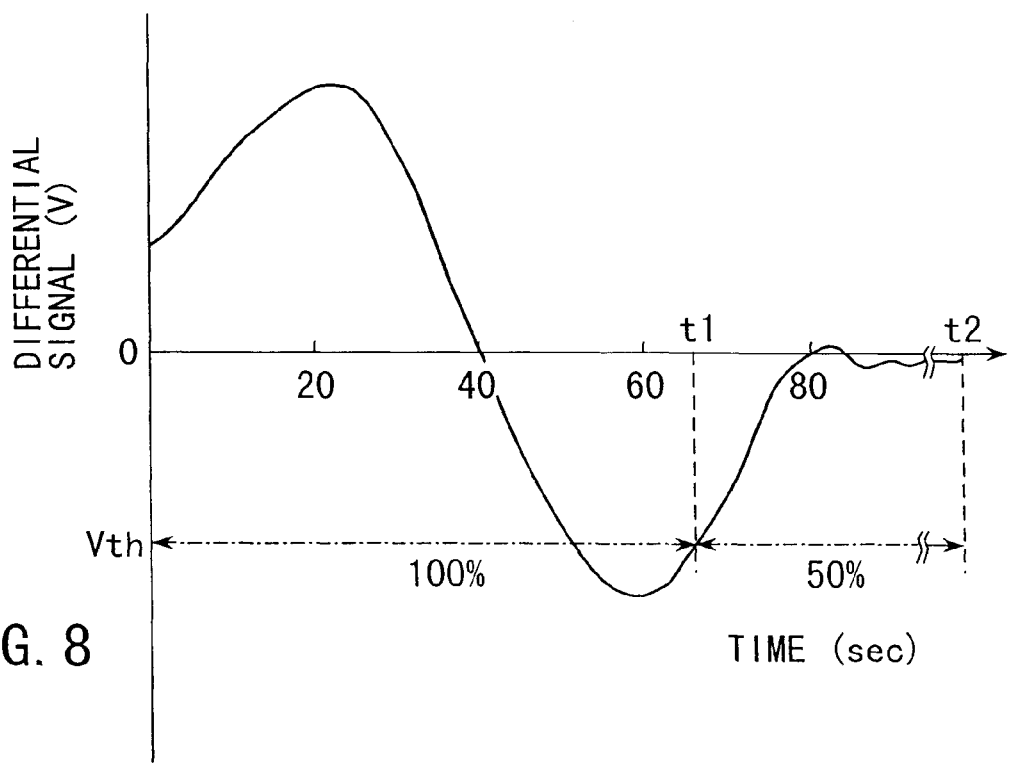
FIG. 8 is a view showing differential signal intensity versus time during ashing.

FIG. 8 shows a differential signal S of the divided voltage VL2/VL1. In this ashing process, as in the etching process, the point of time at which the differential signal crosses the threshold voltage (Vth) of −0.2V on a second time is taken to be the end point.

With the etching time (t1) until the end point taken as 100%, overetching is performed by an additional time corresponding to 50% of the etching time before the etching is terminated. The threshold voltage and the overetching time are appropriately set according to changes in the etching rate, film thickness, and film species.

Figure 4B:
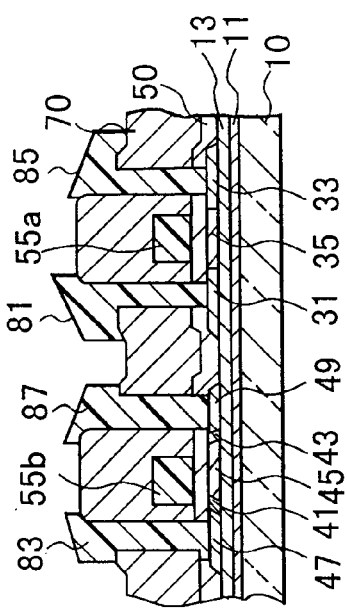

After the etching and ashing are performed successively in the CDE apparatus 100, a TEOS film 50 as a gate insulating film is deposited on the patterned p-Si films 30 and 40 by means of plasma CVD, and a film of Al—Nd alloy of 300 nm in thickness is formed over the TEOS film by sputtering, as sown in FIG. 4B. The Al—Nd alloy film is patterned by means of reactive ion etching (RIE) to form a gate electrode 55a above the p-Si film 30 and a mask pattern 57 above the p-Si film 40.

Subsequently, boron (B) ion is selectively doped into the p-Si film 30 using the gate electrode 55 and the mask pattern 57 as a mask, thereby forming in the p-Si film 30 boron-doped source and drain regions 31 and 33 and a channel region 35 between the source and drain regions.

Figure 4C:
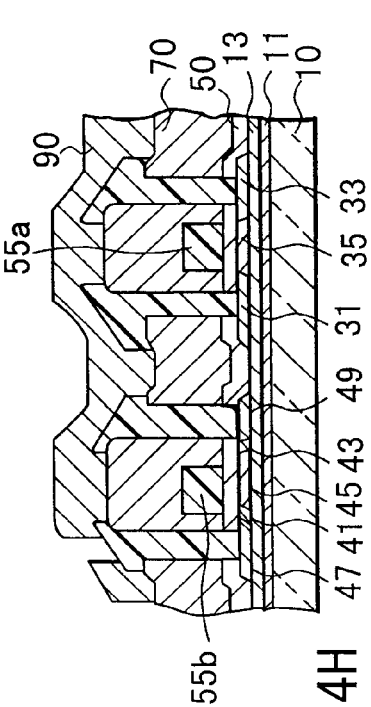

Next, as shown in FIG. 4C, the mask pattern 57 is patterned by means of RIE into a gate electrode 55b and then phosphorous (P) ion is doped into the p-Si film 40 using the gate electrode 55b as a mask, thereby forming lightly-doped drain (LDD) regions 41 and 43 and a channel region 45 between the LDD regions in the p-Si film 40.

Figure 4D:
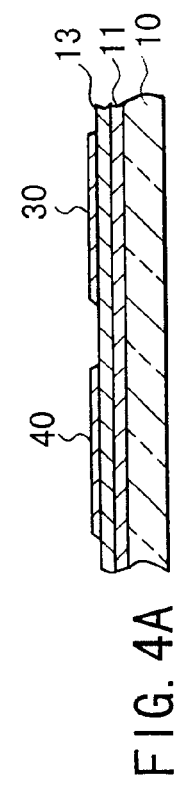

Next, as shown in FIG. 4D, an organic resist is placed to cover selectively the gate electrode 55b and phosphorous (P) ion is doped using the resist as a mask. Thus, in the p-Si film 40 are formed the LDD regions 41 and 43, source and drain regions 47 and 49, and the channel region 45 between the LDD regions 41 and 43.

After that, the entire structure is subjected to heat treatment at a temperature of 500° C. to activate the dopant ion.

Figure 4E:
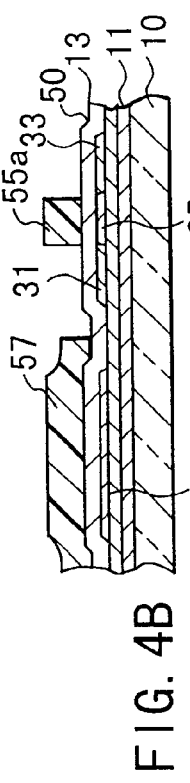

As shown in FIG. 4E, an interlayer insulating film 70 consisting of silicon oxide ($SiO_2$) is deposited by means of plasma CVD to overlie the gate electrodes 55a and 55b, and then an ITO film (not shown) as a transparent electrode is deposited by means of sputtering. These films are then etched into a given pattern.

Figure 4F:
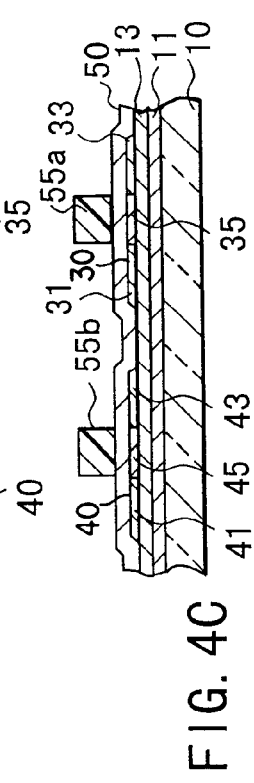

Next, as shown in FIG. 4F, contact holes 71 are formed by means of wet etching in those portions of the TEOS film 50 and the interlayer insulating film 70 which are located above the source and drain regions 31, 33, 47 and 49.

Figure 4G:
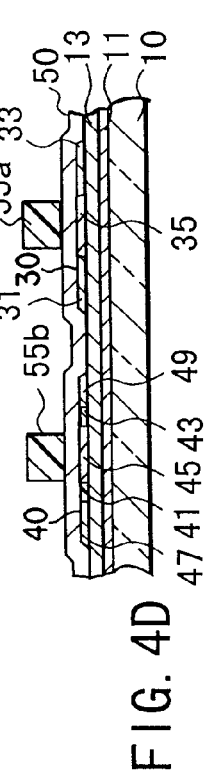

After that, as shown in FIG. 4G, an Al-Nd alloy film is deposited by means of sputtering over the interlayer insulating film 70 and then patterned to thereby form drain electrodes 81 and 83 which are electrically connected to the drain regions 31 and 47, respectively, and source electrodes 85 and 87 which are electrically connected to the source regions 33 and 49, respectively.

Figure 4H:
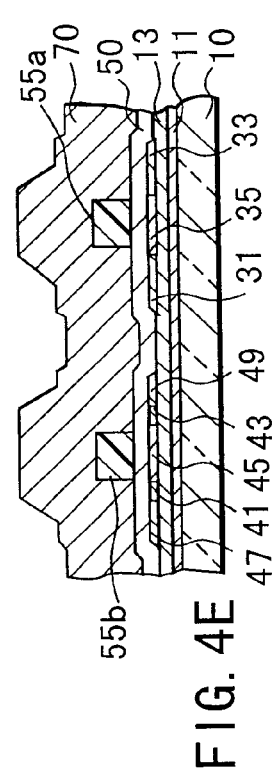

Subsequently, as shown in FIG. 4H, a thin film of SiN is deposited by means of plasma CVD over the entire structure at a thickness of 4500 Å. Using the CDE apparatus 100, a passivation film 90 is formed by patterning the SiN film using a resist pattern as a mask and then ashing the resist pattern for removal thereof.

These patterning and ashing processes are performed as follows. For patterning, a $CF_4$ gas and an $O_2$ gas are supplied at a flow rate of 400 and 100 sccm, respectively, and each at a pressure of 20 Pa.

Figure 9:
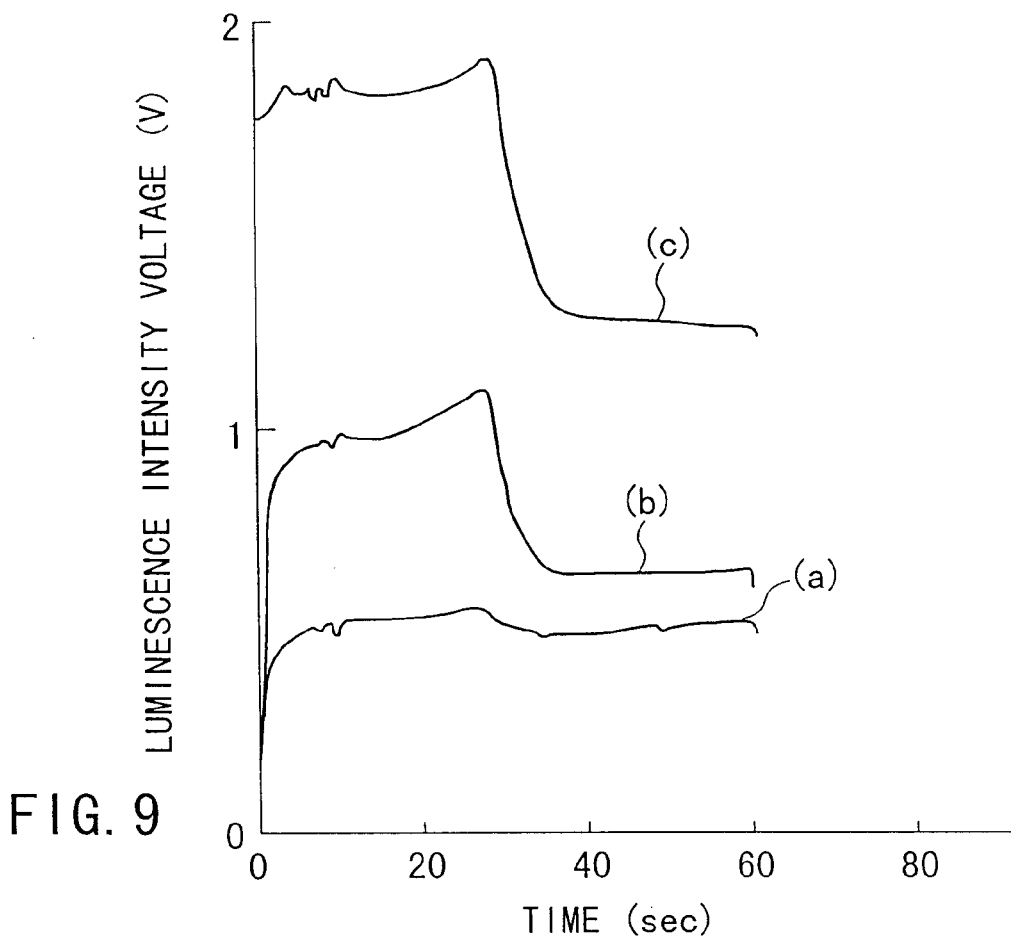
FIG. 9 is a view showing luminescence intensity voltage versus time during etching.

In FIG. 9, the luminescence intensity voltage during etching of the SiN film is plotted against time. In this figure, a curve (a) indicates the total luminescence intensity voltage VL1 for wavelengths in the range of 300 to 800 nm, a curve (b) indicates the specific luminescence intensity voltage VL2 for wavelengths in the range of 650 to 660 nm, and a curve (C) indicates the divided voltage VL2/VL1. From this figure, it can be seen that the change in the divided voltage VL2/VL1 is large in comparison with those in the total luminescence intensity voltage VL1 and the specific luminescence intensity voltage VL2 and is thus fit to detect the end point.

Figure 10:
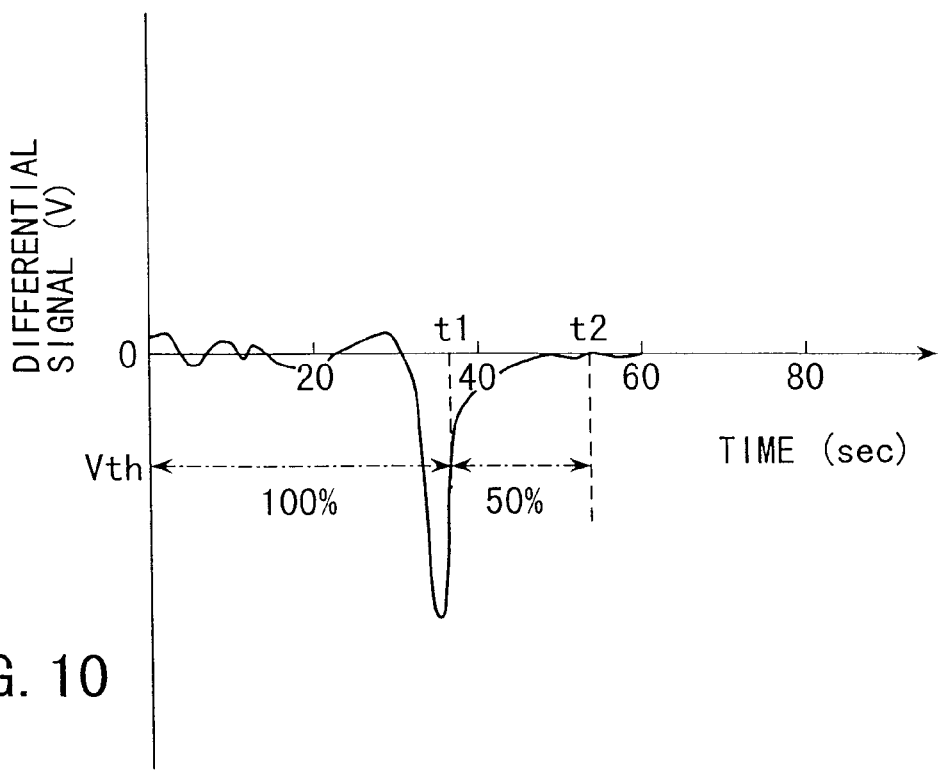
FIG. 10 is a view showing differential signal intensity versus time during etching.

FIG. 10 shows a change of a differential signal S of the divided voltage VL2/VL1 against time (sec). In this embodiment, the point of time at which the differential signal crosses the threshold voltage (Vth) of −0.1V on a second time is taken to be the end point. With the etching time (t1) until the end point taken as 100%, overetching is performed by an additional time corresponding to 30% of the etching time t1 before the etching is terminated. The threshold voltage Vth and the overetching time (t2−t1) are appropriately set according to the etching rate, film thickness, and film species as in the previously described etching process.

Subsequent to the etching process, ashing is performed on the resist mask using the $CF_4$ and $O_2$ gases with their respective flow rates changed to 125 and 1875 sccm.

Figure 11:
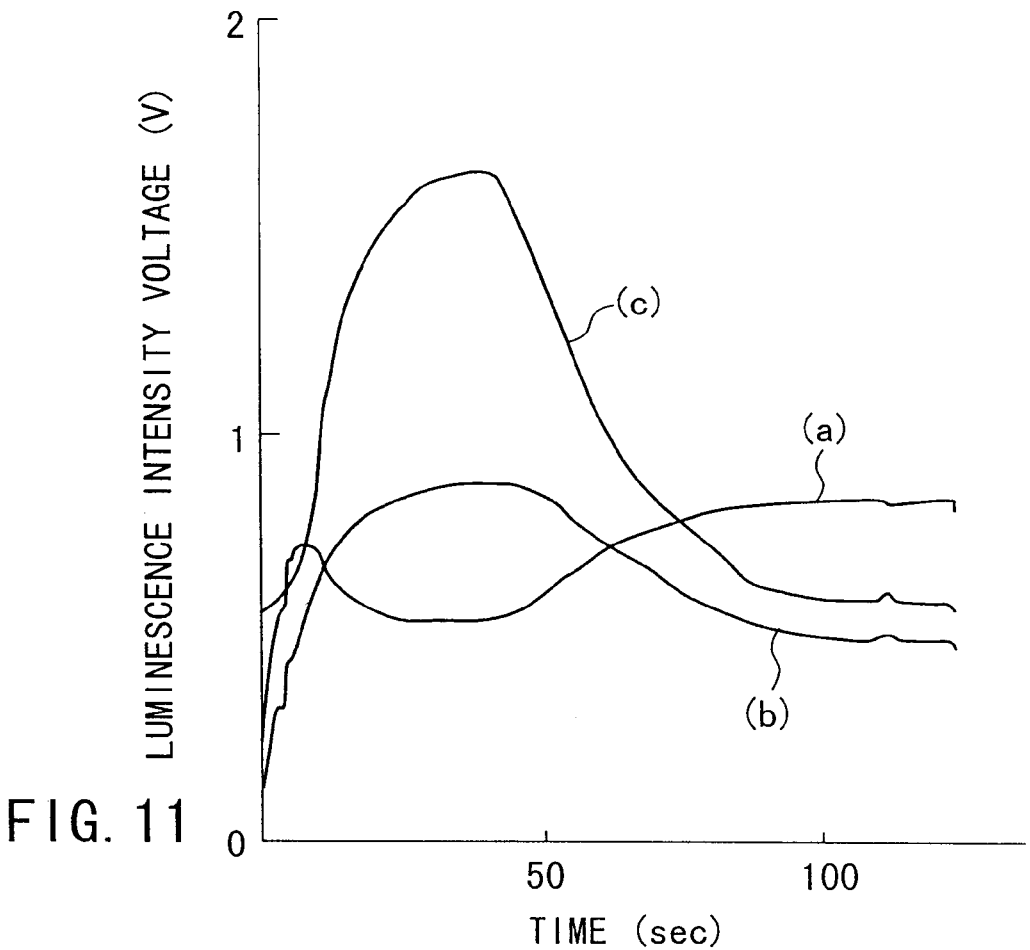
FIG. 11 is a view showing luminescence intensity voltage versus time during ashing.

In FIG. 11, the luminescence intensity voltage during ashing is plotted against time. In this figure, a curve (a) indicates the total luminescence intensity voltage VL1 for wavelengths in the range of 300 to 800 nm, a curve (b) indicates the specific luminescence intensity voltage VL2 for wavelengths in the range of 650 to 660 nm, and a curve (C) indicates the divided voltage VL2/VL1. From this figure, it can be seen that the change in the divided voltage VL2/VL1 is large in comparison with those in the total luminescence intensity voltage VL1 and the specific luminescence intensity voltage VL2 and is thus fit to detect the end point.

Figure 12:
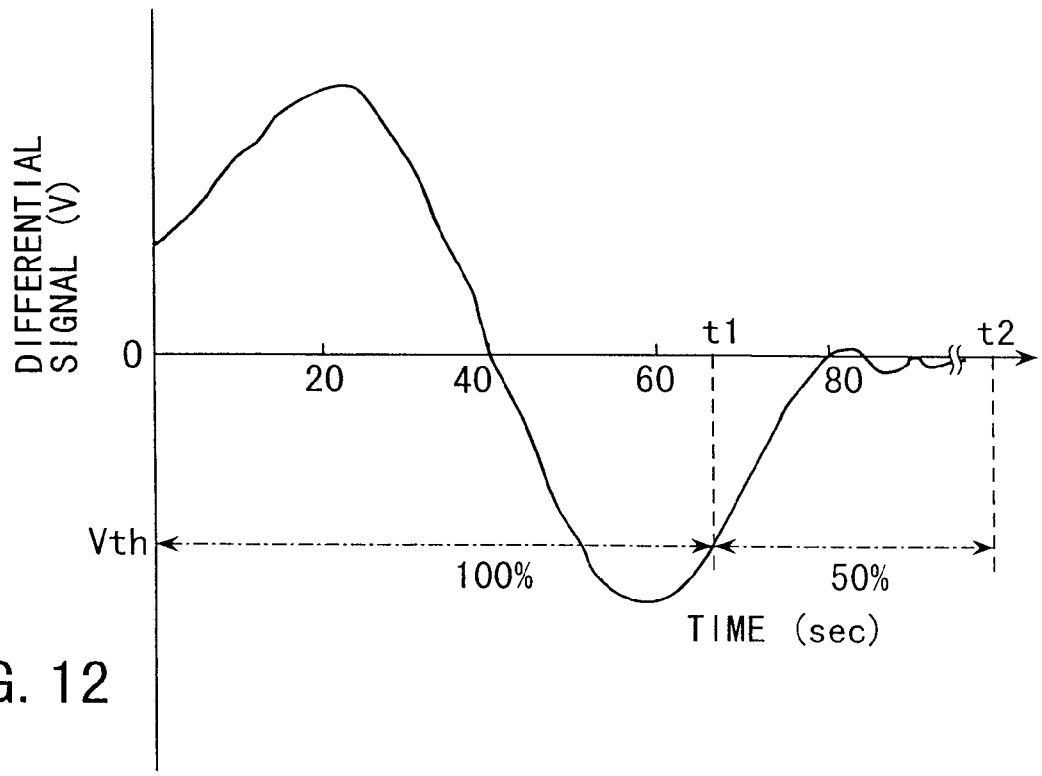
FIG. 12 is a view showing differential signal intensity versus time during ashing.

FIG. 12 shows a differential signal S of the divided voltage VL2/VL1. In this ashing process, as in the etching process, the point of time at which the differential signal crosses the threshold voltage (Vth) of −0.2V on a second time is taken to be the end point. With the etching time (t1) until the end point taken as 100%, overetching is performed by an additional time corresponding to 50% of the etching time before the etching is terminated. The threshold voltage and the overetching time (t2−t1) are appropriately set according to the etching rate, film thickness, and film species as in the etching process.

After that, the resulting substrate is subjected to heat treatment in a hydrogen ambient to stabilize the device characteristics. In this manner, the TFT-LCD array substrate is completed.

As described above, the manufacturing method and apparatus according to the first embodiment of the present invention divides a value for the luminescence intensity at a specific wavelength by a value for the luminescence intensity of all wavelengths and sets up the end point of etching and ashing on the basis of the resulting value. For this reason, a change in the luminescence intensity at the specific wavelength can be detected accurately without being affected by variations in luminescence wavelengths of the entire plasma. As a result, the end point of etching and ashing can be determined accurately. Thus, even with the array substrate of a liquid crystal display device having built-in driver circuits which is large in area and considerably differs from portion to portion in pattern density, uniform and good patterning can be achieved over the entire surface. Therefore, a manufacturing method and apparatus which enable the manufacture of semiconductor devices having excellent characteristics can be provided.

For example, in patterning a p-Si thin film, the embodiment allows each portion of the pattern to be formed with a predetermined taper angle and a good gate insulating film to be formed. Thus, undesired failures of source and drain electrodes due to short-circuiting can be reduced sufficiently in comparison with the conventional techniques, which results in better manufacturing yields.

For either of the p-Si film and the SiN film, in forming a pattern with a setting of, for example, 6 μm in width, the conventional technique produced a variation of ±0.6 μm, while the inventive technique could reduce the variation to ±0.2 μm.

Moreover, to detect the end point of etching and ashing, the manufacturing method and apparatus of the present embodiment are arranged to detect the luminescence intensity of specific wavelengths emitted by molecules or atoms, for examples, hydrogen or nitrogen, which are contained in common in materials to be etched but are not contained in etching gases or underlying components. For this reason, in the case of different materials as well, such as SiNx thin films, p-Si thin films, resist masks consisting of polymeric materials, etc., the end point can be detected accurately. Therefore, the present embodiment allows the CDE apparatus 100 to be used in common for the patterning of p-Si thin films and SiN thin films and the ashing of resist masks. Thus, the space in which the manufacturing apparatus is installed can be reduced significantly. In addition, the patterning and the ashing can be performed successively in the same apparatus, allowing the manufacturing time to be reduced significantly.

Furthermore, according to the manufacturing method described above, the use of a photosensor having a detection accuracy of a predetermined wavelength width allows the end point of either of etching and ashing to be set up accurately. Thus, there is no need of changing the photosensor-detected wavelength or filter for each process, reducing the cost of the manufacturing apparatus.

The present invention may be practiced or embodied in still other ways without departing the scope and spirit thereof. For example, although the above embodiment is arranged to detect a change in luminescence intensity at a specific wavelength, such as 655 or 656 nm, the detection of luminescence intensity at other wavelengths may be used in combination. In addition, although the above embodiment has been described as converting the luminescence intensity during etching or ashing to a voltage for detecting the end point, the luminescence intensity itself may be used to detect the end point or the luminescence intensity may be converted into a current to detect the end point.

Figure 13:
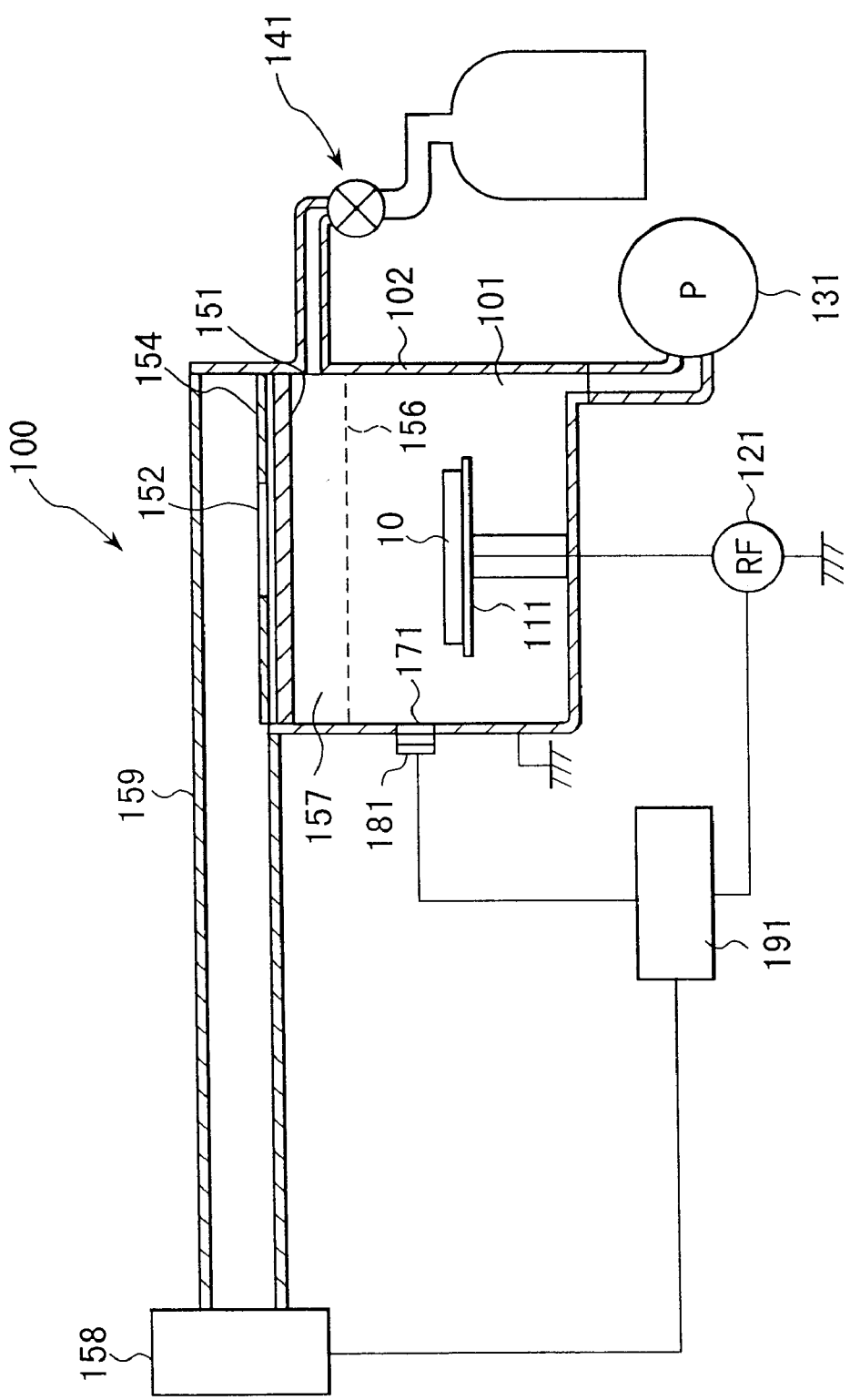
FIG. 13 is a view schematically showing representation of a CDE apparatus according to a second embodiment of the present invention.

The CDE apparatus may use a microwave generator in place of an RF source. According to an embodiment shown in FIG. 13, the CDE apparatus 100 is equipped with a box-like housing 102 defining a vacuum processing chamber 101, a susceptor 111, arranged in the vacuum processing chamber 101, that supports a substrate 10 to be processed and is connected with a RF source 121, a pump 131 for evacuating the vacuum processing chamber 101, and a gas supply system 141 for introducing an etching gas into the vacuum processing chamber 101.

A dielectric plate 151 is placed in the upper portion of the vacuum processing chamber 101 to face the susceptor 111. A slotted antenna 154 with a slot 152 is arranged above the dielectric substrate plate 151. In the vacuum processing chamber 101, a diffusing plate 156 is placed between the susceptor 111 and the dielectric plate 151. A plasma chamber 157 is defined between the dielectric plate 151 and the diffusing plate 156.

The CDE apparatus 100 is provided with a microwave generator 158 instead of an RF source. The microwaves generated from the microwave generator 158 are conducted to the slotted antenna 154 via a waveguide 159. The microwaves then pass through the slot 152 of the antenna 154 to reach the dielectric plate 151, which converts the microwaves into surface waves and induces a plasma in the plasma chamber 157. The induced plasma is radiated uniformly to the substrate 10 through the diffusing plate 156.

In a sidewall of the housing 102 is provided a window 171 that allows the major surface of the susceptor 111 to be monitored from outside. A photosensor 181 is arranged to face the window 171 and connected to a controller 191, which is arranged as in the previously described embodiment and controls the operation of the entire apparatus.

The microwave-based CDE apparatus 100 can also serve the same function as the previously described CDE apparatus.

As described above in detail, the present invention can provide a manufacturing method and apparatus which allows the end point of etching to be detected accurately and thus allows semiconductor devices with good characteristics to be produced.

Moreover, the present invention can provide a semiconductor manufacturing method and apparatus which allows patterning and ashing to be performed in the same apparatus and allows the end point of each of patterning and ashing to be detected accurately.

Furthermore, the present invention can provide a semiconductor manufacturing method and apparatus which allows different types of materials to be etched and the end point of etching of each of the different materials to be detected accurately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a first thin film, formed of non-single crystalline silicon, over an insulating substrate;
    forming a first resist pattern on the first thin film;
    patterning the first thin film by means of vapor phase chemical etching using the first resist pattern as a mask;
    forming a second thin film, formed of non-single crystalline silicon which is different from the first thin film, on the patterned first thin film;
    forming a second resist pattern on the second thin film; and
    patterning the second thin film by means of vapor-phase chemical etching using the second resist pattern as a mask;
    the patterning of the first thin film including detecting a luminescence intensity at a specific wavelength emitted from molecules or atoms which are contained mainly in the first and second thin films during the patterning, and determining the time of termination of the patterning on the basis of a change in the detected luminescence intensity, and
    the patterning of the second thin film including detecting a luminescence intensity at the specific wavelength during the patterning, and determining the time of termination of the patterning on the basis of a change in the detected luminescence intensity.

2. A manufacturing method according to claim 1, wherein the non-single crystalline silicon is either polycrystalline silicon or silicon nitride.

3. A manufacturing method according to claim 2, wherein the first thin film is formed of polycrystalline silicon and the second thin film is formed of silicon nitride.

4. A manufacturing method according to claim 1, wherein the specific wavelengths is approximately 655 nm.

5. A manufacturing method according to claim 1, wherein each of the patternings of the first and second thin film includes detecting, during the vapor-phase chemical etching, a luminescence intensity A of wavelengths within a wavelength range including the specific wavelength, dividing the luminescence intensity at the specific wavelength by the a luminescence intensity A to produce a divide signal, and determining the time of termination of the patterning on the basis of the divide signal.

6. A manufacturing method according to claim 5, wherein the time of termination of each of the patternings is determined on the basis of the rate of change of the divide signal with respect to time.

7. A manufacturing method according to claim 5, wherein the time of termination of each of the patternings is determined on the basis of the rate of change of the divide signal with respect to time and a threshold.

8. A manufacturing method according to claim 7, wherein the time of termination of each of the patternings is determined by the total of a first etching time determined based on the rate of change of the divide signal with respect to time and the threshold and a second etching time that corresponds to a percentage of the first etching time.

9. A method of manufacturing a semiconductor device comprising:
    forming a thin film, formed from non-single crystalline silicon, over an insulating substrate;
    forming a resist pattern on the thin film; and
    patterning the thin film by means of vapor-phase chemical etching using the resist pattern as a mask; and
    after the termination of the patterning, ashing the resist pattern to remove it in continuous with the patterning in a common processing apparatus,
    the patterning including detecting a luminescence intensity at specific wavelengths emitted from molecules or atoms which are contained mainly in the thin film during the patterning, and determining the time of termination of the patterning on the basis of a change in the detected luminescence intensity, and
    the ashing including detecting a luminescence intensity at the specific wavelengths during the ashing, and determining the time of termination of the ashing on the basis of a change in the detected luminescence intensity.

10. A manufacturing method according to claim 9, wherein the non-single crystalline silicon is either of polycrystalline silicon or silicon nitride.

11. A manufacturing method according to claim 9, wherein the specific wavelengths include at least a wavelength corresponding to hydrogen and nitrogen.

12. A manufacturing method according to claim 9, wherein the specific wavelengths include at least 655 and 656 nm.

13. A manufacturing method according to claim 9, wherein the specific wavelengths range from 650 to 660 nm.

14. A manufacturing method according to claim 9, wherein the patterning is performed using a mixture of a carbon-and fluorine-containing gas and an oxygen gas as an etching gas.

15. A manufacturing method according to claim 9, wherein a mixed gas of CF4 and O2 is used as an etching gas.

16. A manufacturing method according to claim 9, wherein each of the patterning and ashing includes detecting a luminescence intensity A of wavelengths within a wavelength range and a luminescence intensity B at the specific wavelengths included in the wavelength range, dividing the luminescence intensity B by the luminescence intensity A to produce a divide signal, and determining the time of termination of the patterning or ashing on the basis of a change of the divide signal.

17. A manufacturing method according to claim 16, wherein the time of termination of the patterning and ashing is determined on the basis of the rate of change of the divide signal with respect to time.

18. A manufacturing method according to claim 16, wherein the time of termination of the patterning and ashing is determined on the basis of the rate of change of the divide signal with respect to time and a threshold.

19. A manufacturing method according to claim 18, wherein the time of termination of the patterning and ashing is determined by the total of a first etching time determined based on the rate of change of the divide signal with respect to time and the threshold and a second etching time that corresponds to a percentage of the first etching time.

* * * * *